United States Patent [19]

Sakai

[11] Patent Number: 5,126,571
[45] Date of Patent: Jun. 30, 1992

[54] SEMICONDUCTOR MANUFACTURING APPARATUS

[76] Inventor: Katsuhiko Sakai, 8-2-204, Jyoutou 2-chome, Mito-shi, Ibaraki, Japan, 310

[21] Appl. No.: 627,854

[22] Filed: Dec. 14, 1990

[30] Foreign Application Priority Data

Dec. 21, 1989 [JP] Japan .................. 1-329523

[51] Int. Cl.⁵ .......................... H01J 37/30
[52] U.S. Cl. .................. 250/443.1; 250/442.11
[58] Field of Search ............ 250/442.1, 443.1, 452.2

[56] References Cited

U.S. PATENT DOCUMENTS

| 4,453,080 | 6/1984 | Berkowitz | 250/443.1 |
| 4,458,746 | 7/1984 | Holden . | |
| 4,537,244 | 8/1985 | Holden . | |
| 4,599,516 | 7/1986 | Taya et al. | 250/443.1 |
| 4,806,769 | 2/1989 | Mori et al. | 250/443.1 |

FOREIGN PATENT DOCUMENTS

| 72297 | 6/1978 | Japan | 250/443.1 |
| 63-13442 | 6/1988 | Japan . | |
| 64-42577 | 2/1989 | Japan . | |

Primary Examiner—Bruce C. Anderson

[57] ABSTRACT

A semiconductor manufacturing apparatus for manufacturing a semiconductor device by treating a semiconductor wafer, comprising a vacuum implanting room, a wafer holder for installing the semiconductor wafer in the implanting room, nozzles provided in the wafer holder for evaporating a liquid refrigerant, and a compressor for supplying the liquid refrigerant to the nozzles through wall of the implanting room. As the refrigerant is compressed into the nozzles in a liquid state and evaporated in the vacuum implanting room, the semiconductor manufacturing apparatus is neither frozen nor frosted by the moisture in the ambient air.

11 Claims, 4 Drawing Sheets

SEMICONDUCTOR MANUFACTURING APPARATUS

BACKGROUND OF THE INVENTION

The present invention relates to a semiconductor manufacturing apparatus and more particularly to the semiconductor manufacturing apparatus such as an ion implanter which implants an ion beam on a semiconductor and treats the semiconductor wafer at a low temperature.

The most popular semiconductor manufacturing apparatus is an ion implanter in which, as shown in FIG. 2, ions emitted from an ion source 1 forms an ion beam 4 and are deflected in a elbow duct 5 so as to be separated according to mass thereof by an electric magnet 3. The respective ions having a predetermined mass are selected by a slit 6 so as to be implanted into the semiconductor wafer 7 in an implanting room 8. The semiconductor wafer installed on a wafer 7 holder of the ion implanter is cooled using cooling water so as to decrease a thermal resistance between the wafer and the wafer holder and to effectively cool the semiconductor wafer.

Examples of an ion implanter are found in, for example; Japanese Patent Laid-open No. 63-133442 (1988) and 64-42577 (1989) and U.S. Pat. Nos. 4,458,746, 4,537,244 and 4,806,769.

But in the conventional semiconductor manufacturing apparatus which use water as a coolant for the wafer holder, the temperature of the semiconductor wafer becomes rather high because of the high thermal resistance between the wafer and the wafer holder.

Recently, it has become necessary to cool the semiconductor wafer below water freezing temperature 0° C. in order to effectively treat the wafer. Some conventional semiconductor manufacturing apparatus uses liquid Nitrogen as refrigerant,: however, since the temperature of liquid Nitrogen is very cold, the pipe or connecting part of the pipe for the liquid Nitrogen either becomes frozen or frosted from moisture in the air. Such freezing or frosting is serious problem for the semiconductor manufacturing apparatus. Furthermore, it is difficult for the conventional semiconductor manufacturing apparatus to control the temperature of the wafer holder with high accuracy because of its very low temperature and wide temperature control range such as from a room temperature to −200° C.

SUMMARY OF THE INVENTION

The present invention seeks to overcome the above mentioned problem of the conventional technique.

An object of present invention is to provide a semiconductor manufacturing apparatus which does not freeze or frost due to moisture in the air and is capable of controlling the temperature of the wafer holder below the room temperature with a high accuracy.

In order to attain the above mentioned object, the semiconductor manufacturing apparatus for treating a semiconductor wafer in the present invention comprises a vacuum implanting room, a wafer holder for installing the semiconductor wafer which is disposed in the implanting room, a nozzle connected to the wafer holder for evaporating a liquid refrigerant, a first pipe for supplying the liquid refrigerant to the nozzle through the implanting room, a second pipe for exhausting the evaporated refrigerant from the implanting room, and a compressor for compressing the liquid refrigerant into the first pipe.

As the first pipe supplies the refrigerant into the nozzle in a liquid state and the nozzle evaporates the refrigerant in the vacuum implanting room, the semiconductor wafer on the wafer holder is fully cooled without freezing or frosting of the wall of the vacuum implanting room and the first pipe due to moisture in the air.

DETAILED DESCRIPTION OF THE PREFERRED EMBODIMENTS

Figure 1:
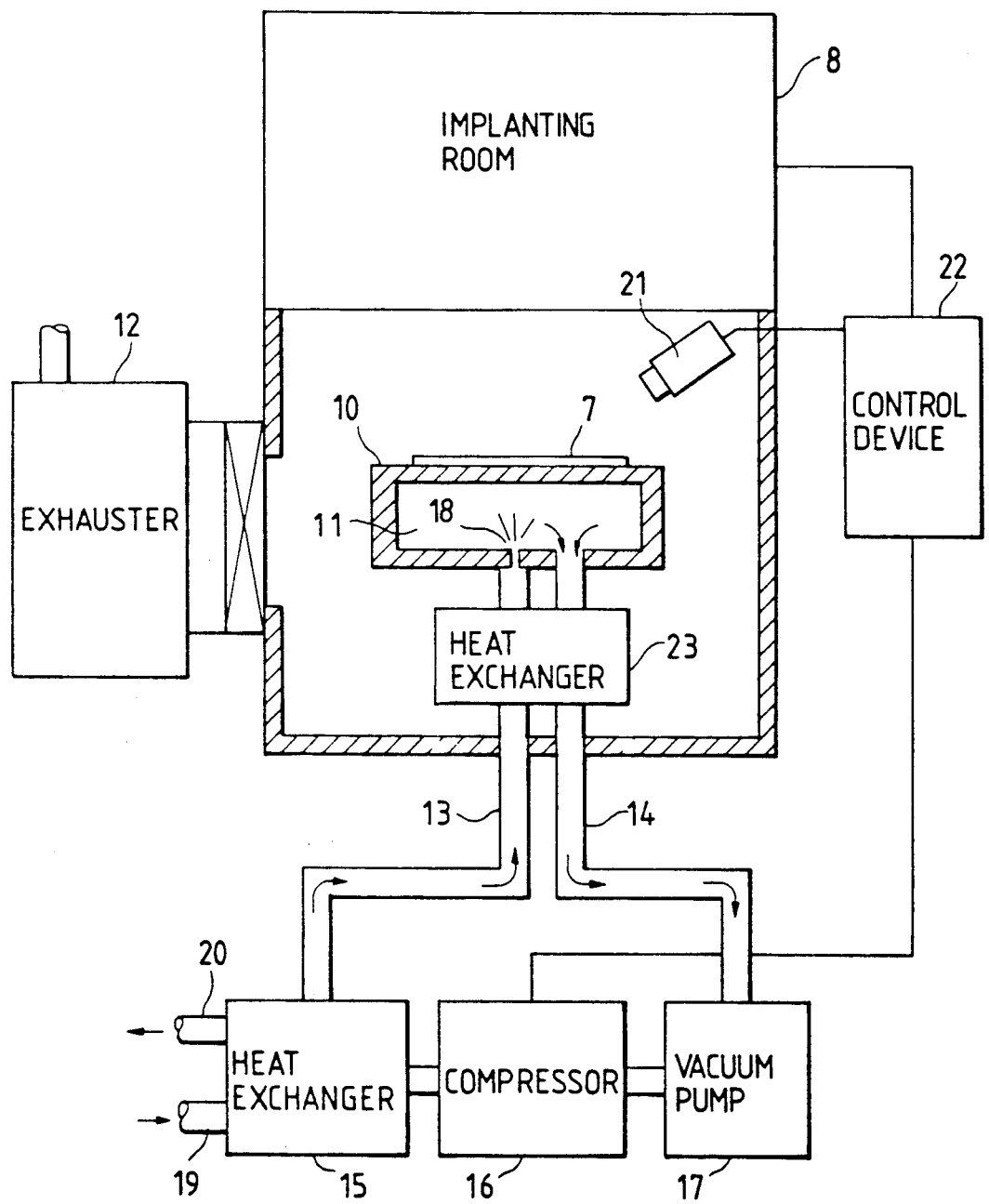
FIG. 1 is a diagrammatic cross-sectional view of an embodiment of a semiconductor manufacturing apparatus of the present invention.
Figure 2:
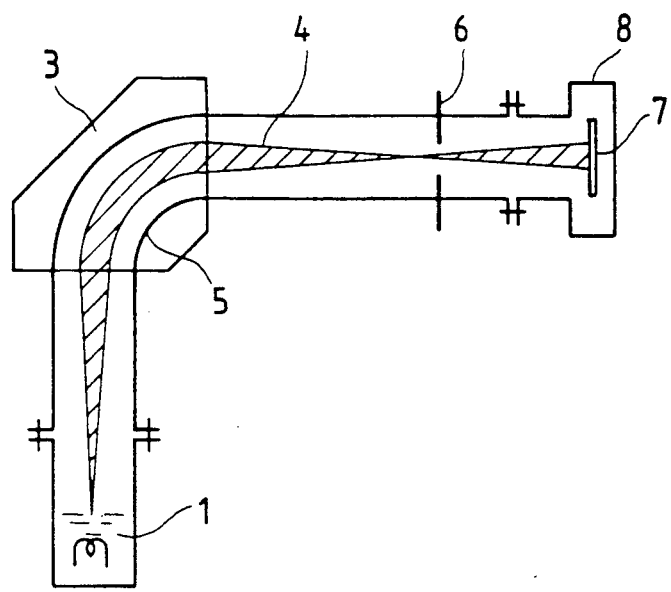
FIG. 2 is a diagrammatic cross-sectional view of an example of a conventional ion implanting apparatus.

In FIG. 1 a semiconductor wafer 7 on a wafer holder 10 disposed in a implanting room 8 is irradiated with an ion beam from upper side of the implanting room 8. The implanting room 8 is exhausted by a exhauster 12 so as to obtain a high vacuum. A hollow portion 11 in the wafer holder 10 is supplied with a refrigerant from a nozzle 18 which is supplied from a tube 13 in a liquid state and the refrigerant from the nozzle 18 is evaporated in the hollow portion 11 so as to cool the wafer holder 10 and the semiconductor wafer 7 because of heat of vaporization of the refrigerant. An inner diameter of tip of the nozzle 18 is designed so as to emit a required amount of the refrigerant. The evaporated refrigerant is exhausted by a vacuum pump 17 through a tube 14, compressed by a compressor 16 so as to be liquefied again, and retransmitted to the wafer holder 10 after being cooled by a heat exchanger 15. Tubes 19, 20 are provided for transmitting cooling water through the heat exchanger 15.

In the embodiment of FIG. 1, the vacuum pump 17 effectively evaporates the refrigerant effectively in the hollow portion 11, but when the compressor 16 has a full function of exhausting the evaporated refrigerant, the vacuum pump 17 may be deleted.

Since the exhausted refrigerant passing through the tube 14 is still cooled, a heat exchanger 23 is provided between pipe 13 and pipe 14 so as to cool the liquid refrigerant passing through the tube 13.

In the ion implanting room 8, a temperature detector 21 is provided and detects an infrared ray. The infrared ray detected by the detector 21 is inputted to a control device 22 and controls the compressor 16 by comparing with an ordering value of the temperature which is not shown in FIG. 1. The temperature of the semiconductor wafer 7, 1 are controlled so as to maintain required value by varying the ordering value of the temperature.

The hollow portion 11 of the wafer holder 10 is cooled so as to maintain a boiling point of the refrigerant and, the lower the pressure in the hollow portion 11, the lower the boiling point of the refrigerant. For example, when using a liquid Nitrogen, the temperature of the hollow portion 11 becomes about −190° C. because the boiling point of the liquid Nitrogen is −195° C. In the same way, when using Freon 22, the temperature of the hollow portion 11 becomes about −40° C. Furthermore when the pressure in the hollow portion 11 is 0.1 atm using a liquid Nitrogen as the refrigerant, the temperature of the hollow portion 11 becomes below −200° C.

In the embodiment of FIG. 1 as the refrigerant is supplied into the nozzle 18 in a liquid state and the nozzle 18 evaporates the refrigerant in the vacuum implanting room 8, the semiconductor wafer 1 on the wafer holder 10 is fully cooled, and the pipe 13 is not so cooled because the refrigerant is compressed into the pipe 13 in the liquid state and the wall of the vacuum implanting room 8 is also to be too not so cooled too because the vacuum in the implanting room 8 does not conduct cooled energy of the wafer holder 10 to the wall of the implanting room 8. Thus, no portion outside of the ion implanter is frozen or frosted by moisture in the air.

Figure 3:
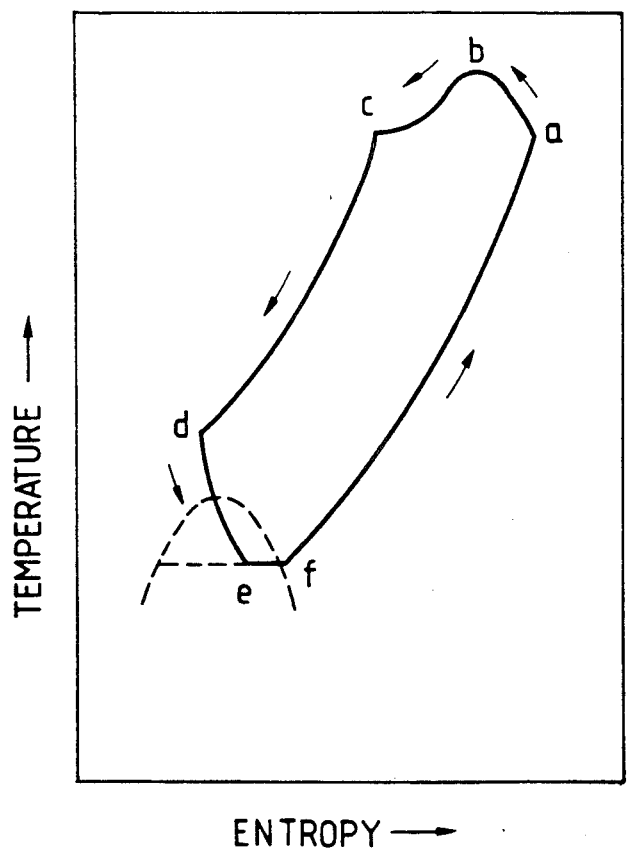
FIG. 3 graphically illustrates a relationship of temperature and entropy in a refrigerating cycle of the semiconductor manufacturing apparatus of the present invention.

As shown in FIG. 3, the entropy of the refrigerant goes down as points (a), (b) and (c) in FIG. 3 in the process when the refrigerant passes through the vacuum pump 17, the compressor 16 and the heat exchanger 15 in FIG. 1, and further the entropy goes down towards point (d) in the step reaching point (d). Then, when the refrigerant is expanded adiabatically in the hollow portion 11, the entropy goes down like point (e) and then increases up to point (a) by being heated with the wafer 7 so as to close the above mentioned refrigerating cycle.

Figure 4:
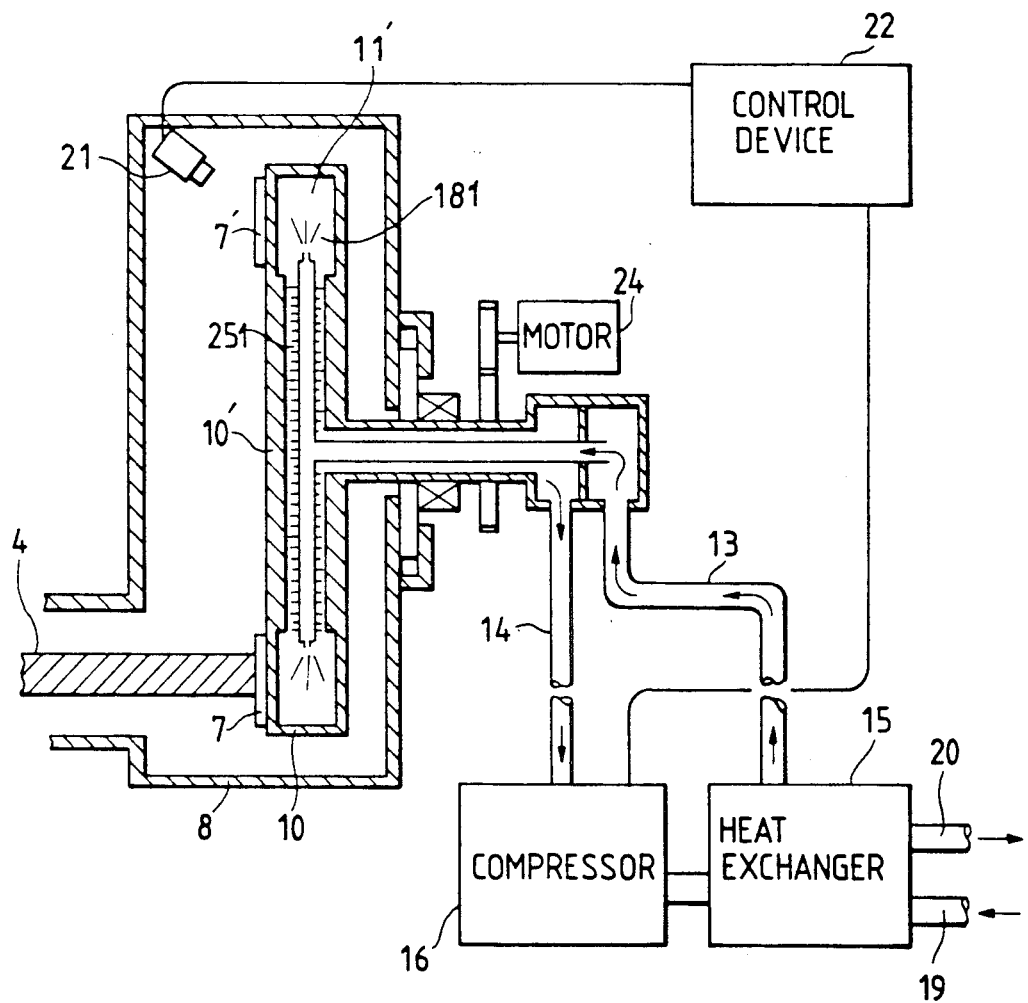
FIG. 4 shows a diagrammatic cross-sectional view of an another embodiment of a semiconductor manufacturing apparatus of the present invention.

In FIG. 4, ion beam 4 is introduced into the vacuum ion implanting room 8 and is irradiated to the plural semiconductor wafers 7, 7'. The semiconductor wafers 7, 7' are disposed on an outer circumference of a circular wafer holder 10' which is rotated by a motor 24 so as to be sequentially implanted with the ion beam 4. A hollow portion 11' is provided in a circumferential inner portion of the wafer holder 10', with the refrigerant being evaporated in the hollow portion 11'. In the wafer holder 10', many fins are disposed on inside of the wafer holder 10' and a refrigerant guide portion 251 and the liquid refrigerant passes through the refrigerant guide portion 251 and supplied from a plurality of nozzles 18 so as to be evaporated and cool the wafer holder 10'. The evaporated refrigerant is transmitted to the compressor through the tube 14 and is compressed by the compressor so as to be reliquefied, and the liquefied refrigerant is cooled by the heat exchanger 15 and transmitted to the wafer holder 10' through the tube 13.

The refrigerant which is transmitted to the nozzle 181 through inside of a inner tube connected to the wafer holder 10', as shown in FIG. 4, is evaporated by the nozzle 181 and exhausted to the outside of the inner tube so as to cool the refrigerant passing through the inside of the inner tube. Therefore, the inner tube shown in FIG. 4 functions as a heat exchanger 23 shown in FIG. 1. In FIG. 4, a vacuum pump is not shown, but the ion implanting room 8 is exhausted of air by the vacuum pump so as to evacuate the ion implanting room 8.

In FIG. 4, the plurality semiconductor wafers, respectively having a diameter about 200 mm, are disposed on the circumference of the wafer holder 10' and the ion beam 4 having a diameter 40 to 50 mm, is irradiated for a periods of 5 to 10 minutes. At the time, the wafer holder 10' is rotated with a rotational speed about 720 r.p.m. and the rotational axis of the wafer holder 10' is moved by a mechanism having a motor around the nozzle 181 shown in FIG. 4 with the speed of tens mm/second so as to be able to irradiate the whole surface of the semiconductor wafers 7, 7' and to uniformly cool the whole.

Power of the ion beam 4 is about 2 kW. Therefore the semiconductor wafers 7, 7' and wafer holder 10' are heated with the power of 2 kW and the power of 2 kW is removed by the evaporating effect of the refrigerant so as to keep the wafers 7, 7' at a predetermined temperature. Because of the large amount of removed energy, reproduction of the refrigerant by using the compressor 16 and the heat exchanger 15 is useful in order to effectively drive the ion implanter.

Furthermore, as many wafers, for example ten wafers, respectively having a diameter 200 mm, are displaced on the circumference of the wafer holder 10', diameter of the wafer holder becomes more than 800 mm, weight of the wafer holder 10' is very heavy in spite of using aluminum as materials and it takes much time for starting up of the ion implanter. Therefore the wafer holder member should be as thin as possible and at the same time, the evaporated refrigerant should be uniformly emitted behind the wafer holder 10' where the wafers 7, 7' are installed because the temperature on the wafer holder 10' tends not to be uniform when the wafer holder member is very thin. Wafer holders shown in FIGS. 5, 6, 7 are designed in order to attain such object stated above.

Figure 5:
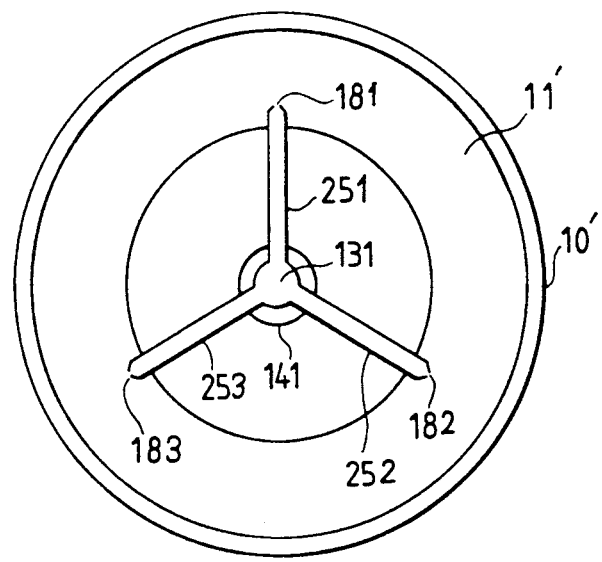
FIGS. 5, 6 and 7 show diagrammatic cross-sectional views of examples of the wafer holders in the present invention.

In FIG. 5, three refrigerant guide portions 251, 252, 253 are provided and nozzles 181, 182, 183 are respectively provided at tip portions of the three refrigerant guide portions 251, 252, 253. The liquid refrigerant transmitted through the tube 13 is divided into the three refrigerant guide portions 251, 252, 253 and respectively transmitted to the nozzles 181, 182, 183 so as to be emitted. At this time, as respective lengths of the refrigerant guide portions are changed, back portions of the wafer holder installing the wafers are uniformly cooled. Furthermore, the more the number of the refrigerant guide portions, the more uniformly are the back portions cooled.

Figure 6:
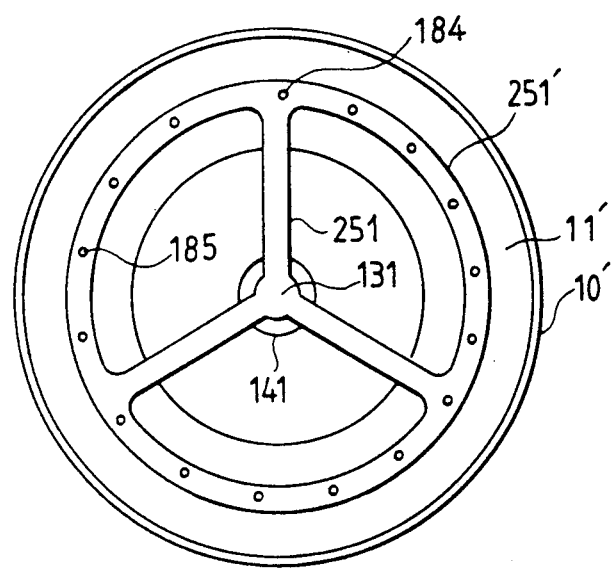

In FIG. 6, the refrigerant guide portions 251, 252 are connected with the nozzle tube 251', and the refrigerant guide portions 252, 253 and 253, 251 are respectively connected with another nozzle tubes. The nozzle tubes 251' are arranged along a circle. On the nozzle tube 251', many nozzles 184, 185 are provided and number of the nozzles 184, 185 may easily be increased as required so as to uniformly cool the wafer holder and the wafers.

Figure 7:
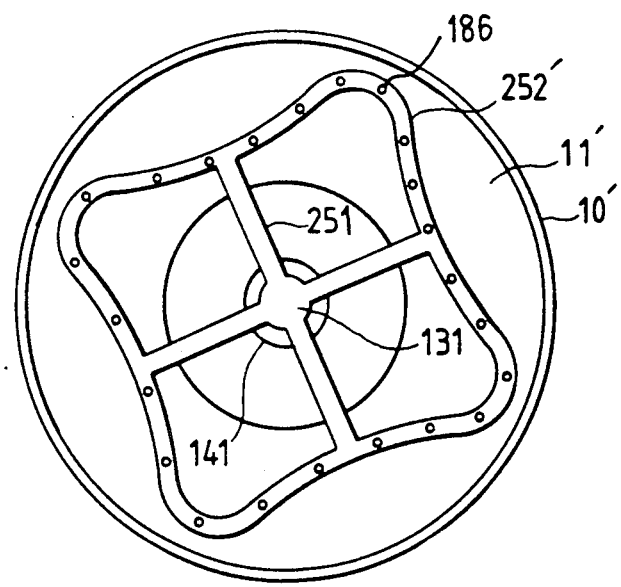

In FIG. 7, as nozzle tube 252', having many nozzles 186, is formed like a snaking tube so as to spread cooling area behind the wafer holder 10' and the wafer holder 10' is turned around the nozzle tube 252' so as to spread cooling area of the wafer holder 10', whereby the wafer holder 10' and the wafers 7, 7' are uniformly cooled.

Furthermore in FIGS. 1, 4, the fins provided inside of the wafer holder 10 or 10' are arranged so as to be coaxial or radical with respect to the rotational axis of the wafer holder corresponding to volume of the hollow portion 11 or 11' of the wafer holder 10 or 10' or rotational speed of the wafer holder 10'. The temperature of the wafers 7, 7' are adjusted by controlling the volume of the refrigerant emitted from the nozzle. If necessary, the temperature of the wafers 7, 7' may be changed widely by emitting the refrigerant intermittently and controlling the emitting intervals of the refrigerant.

I claim:

1. A semiconductor manufacturing apparatus for manufacturing a semiconductor device by treating at least one semiconductor wafer, the apparatus comprising:

an implanting room for implanting an ion beam to the semiconductor wafer, said implanting room being exhausted by an exhauster, a wafer holder means disposed in the implanting room and having a hollow portion therein for accommodating the at least one semiconductor wafer in the implanting room, a nozzle means connected to the wafer holder means for discharging a liquid refrigerant into the hollow portion so as to evaporate the liquid refrigerant, a first pipe means for supplying the liquid refrigerant to the nozzle means, a second pipe means for exhausting the evaporated refrigerant out of the implanting room, and a compressor means disposed outside of the implanting room for compressing the liquid refrigerant in the first pipe means so as to discharge the liquid refrigerant from the nozzle means.

2. A semiconductor manufacturing apparatus as defined in claim 1, further comprising:

a heat exchanger means for cooling the liquid refrigerant from the compressor means.

3. A semiconductor manufacturing apparatus as defined in claim 1, wherein said compressor means controls a volume of the liquid refrigerant supplied to the nozzle means by detecting a temperature of the wafer holder means so as to adjust the temperature of the wafer holder means so as to adjust the temperature of the wafer holder means.

4. A semiconductor manufacturing apparatus as defined in claim 1, wherein said first pipe means is disposed inside of said second pipe means.

5. A semiconductor manufacturing apparatus as defined in claim 1, wherein said wafer holder means is shaped as a circular plate, and wherein the at least one semiconductor wafer is accommodated at a circumference of the circular plate.

6. A semiconductor manufacturing apparatus as defined in claim 5, wherein said wafer holder means turns around said nozzle means.

7. A semiconductor manufacturing apparatus as defined in claim 5, wherein a plurality of said nozzle means are arranged along the circumference of the circular plate.

8. A semiconductor manufacturing apparatus as defined in claim 5, further comprising:

a motor means for rotating said wafer holder means.

9. A semiconductor manufacturing apparatus as defined in claim 1, further comprising:

a plurality of fins provided in said wafer holder means, said fins being cooled by evaporated refrigerant from said nozzle means.

10. A semiconductor manufacturing apparatus as defined in claim 1, further comprising:

a heat exchanger arranged in the implanting room and connected to the first and second pipe means.

11. A semiconductor manufacturing apparatus as defined in claim 1, wherein said compressor means liquifies the refrigerant exhausted from the second pipe means.

* * * * *